(12) United States Patent
Kuno et al.

(10) Patent No.: US 12,040,165 B2
(45) Date of Patent: Jul. 16, 2024

(54) WAFER PLACEMENT TABLE

(71) Applicant: NGK Insulators, Ltd., Nagoya (JP)

(72) Inventors: Tatsuya Kuno, Nagoya (JP); Seiya Inoue, Handa (JP); Hiroshi Takebayashi, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 104 days.

(21) Appl. No.: 17/807,401

(22) Filed: Jun. 17, 2022

(65) Prior Publication Data
US 2023/0111137 A1   Apr. 13, 2023

(30) Foreign Application Priority Data
Oct. 8, 2021   (JP) .................................. 2021-166081

(51) Int. Cl.
| | | |
|---|---|---|
| H01J 37/32 | (2006.01) | |
| C23C 16/458 | (2006.01) | |
| H01L 21/683 | (2006.01) | |

(52) U.S. Cl.
CPC .... *H01J 37/32724* (2013.01); *C23C 16/4586* (2013.01); *H01L 21/6833* (2013.01)

(58) Field of Classification Search
CPC ......... H01L 21/67109; H01L 21/68785; H01L 21/68757; H01L 21/6833; H01L 21/6831;
(Continued)

(56) References Cited

U.S. PATENT DOCUMENTS

| | | |
|---|---|---|
| 5,794,838 A | 8/1998 | Ushikoshi et al. |
| 9,255,747 B2 | 2/2016 | Jindo et al. |
| 9,257,315 B2 | 2/2016 | Jindo et al. |
| 2009/0280299 A1* | 11/2009 | Ferrrato ............... B23K 1/0012 428/157 |

(Continued)

FOREIGN PATENT DOCUMENTS

| | | |
|---|---|---|
| JP | H04-287344 A | 10/1992 |
| JP | 2012142413 A | 7/2012 |

(Continued)

OTHER PUBLICATIONS

Taiwanese Office Action dated Jun. 5, 2023 (Application No. 111124441).
(Continued)

*Primary Examiner* — Kevin J Comber
(74) *Attorney, Agent, or Firm* — BURR PATENT LAW, PLLC

(57) ABSTRACT

A wafer placement table includes a ceramic base having a wafer placement surface on its top surface and incorporating an electrode, a cooling base in which a refrigerant flow channel is formed, and a metal bonding layer that bonds the ceramic base with the cooling base. The cooling base includes a ceiling base made of a metal matrix composite material or a low thermal expansion metal material and defining a ceiling of the refrigerant flow channel, a grooved base of which a main component is made of the same ceramic material as a main component of the ceramic base and on a top surface of which a flow channel groove defining a bottom and a side wall of the refrigerant flow channel is provided, and a metal ceiling bonding layer that bonds a bottom surface of the ceiling base with the top surface of the grooved base.

7 Claims, 5 Drawing Sheets

(58) Field of Classification Search
CPC ............. C23C 16/4581; C23C 16/4586; H01J 37/32724
USPC ....................................................... 361/234
See application file for complete search history.

(56) References Cited

U.S. PATENT DOCUMENTS

| | | | |
|---|---|---|---|
| 2015/0036261 A1 | 2/2015 | Jindo et al. | |
| 2015/0077895 A1* | 3/2015 | Jindo | C04B 35/645 228/121 |
| 2019/0244795 A1 | 8/2019 | Tandou et al. | |
| 2022/0262657 A1* | 8/2022 | Mahakali | H01L 21/68785 |

FOREIGN PATENT DOCUMENTS

| | | |
|---|---|---|
| JP | 5666748 B1 | 2/2015 |
| JP | 5666749 B1 | 2/2015 |
| JP | 6176771 B2 | 8/2017 |
| KR | 10-2014-0137016 A | 12/2014 |
| TW | 379209 B | 1/2000 |
| TW | 200826226 A | 6/2008 |
| TW | 201936014 A | 9/2019 |
| WO | WO2014156543 A1 | 2/2017 |

OTHER PUBLICATIONS

Taiwanese Office Action (Application No. 111124441) dated Sep. 8, 2023 (9 pages).
Korean Office Action (with English translation) dated Apr. 2, 2024 (Application No. 10-2022-0082012).
Japanese Office Action (with English translation), Japanese Application No. 2021-166081, dated May 21, 2024 (10 pages).

* cited by examiner

WAFER PLACEMENT TABLE

BACKGROUND OF THE INVENTION

1. Field of the Invention

The present invention relates to a wafer placement table.

2. Description of the Related Art

Hitherto, there is known a wafer placement table in which a ceramic base made of alumina or the like in which an electrostatic attraction electrode is embedded and a cooling base made of metal, such as aluminum, are bonded to each other via a resin layer (see, for example, Patent Literature 1). With such a wafer placement table, the influence of a difference in coefficient of thermal expansion between a ceramic base and a cooling base can be reduced by a resin layer. There is also known a wafer placement table in which a ceramic base and a cooling base having a refrigerant flow channel are bonded to each other by using a metal bonding layer instead of a resin layer (see, for example, Patent Literatures 2 and 3). Since a metal bonding layer is higher in thermal conductivity than a resin layer, it is possible to achieve heat dissipation performance required in the case where a wafer is processed with high-power plasma. On the other hand, since a metal bonding layer is higher in Young's modulus and lower in stress relaxation properties than a resin layer, the influence of a difference in thermal expansion between a ceramic base and a cooling base almost cannot be reduced. In Patent Literatures 2 and 3, to make it difficult to break due to a difference in thermal expansion, a metal matrix composite material (MMC) with a small difference in coefficient of thermal expansion from a ceramic base is used as the material of a cooling base.

CITATION LIST

Patent Literature

PTL 1: JP H4-287344 A
PTL 2: JP 5666748 B
PTL 3: JP 5666749 B

SUMMARY OF THE INVENTION

However, an MMC is more expensive, difficult to work, and higher in cost for forming a refrigerant flow channel than metal, such as aluminum, so a manufacturing cost for a wafer placement table can increase. It is also conceivable to use a low thermal expansion metal material with a small difference in coefficient of thermal expansion from a ceramic base instead of an MMC; however, the low thermal expansion coefficient metal material is also expensive, difficult to work, and high in cost for forming a refrigerant flow channel, so a manufacturing cost for a wafer placement table can increase.

The present invention is made to solve such an inconvenience, and it is a main object to reduce a manufacturing cost for a wafer placement table having high heat dissipation performance and difficult to break.

A first wafer placement table of the present invention includes a ceramic base having a wafer placement surface on its top surface and incorporating an electrode, a cooling base in which a refrigerant flow channel is formed, and a metal bonding layer that bonds a bottom surface of the ceramic base with a top surface of the cooling base, wherein the cooling base includes a ceiling base made of a metal matrix composite material or a low thermal expansion metal material and defining a ceiling of the refrigerant flow channel, a grooved base of which a main component is made of the same ceramic material as a main component of the ceramic base and on a top surface of which a flow channel groove defining a bottom and a side wall of the refrigerant flow channel is provided, and a metal ceiling bonding layer that bonds a bottom surface of the ceiling base with the top surface of the grooved base.

In the first wafer placement table of the present invention, of the cooling base, an MMC or a low thermal expansion metal material is used for the ceiling base, while a ceramic material that is relatively inexpensive and with which a flow channel groove is able to be formed with a relatively low cost by a near-net-shape manufacturing technology or the like is used for the grooved base. Therefore, a manufacturing cost for the wafer placement table is reduced. In addition, not a resin layer with a low thermal conductivity but a metal bonding layer with a high thermal conductivity is used as the bonding layer between the ceramic base and the ceiling base and between the ceiling base and the grooved base. Therefore, performance to dissipate heat from a wafer (heat dissipation performance) is high. Furthermore, since the main component of the ceramic material that is a component of the grooved base is the same as the main component of the ceramic material that is a component of the ceramic base, the absolute value of a difference in coefficient of linear thermal expansion between the grooved base and the ceramic base is small. Therefore, the absolute value of a difference in coefficient of linear thermal expansion between any two of the ceramic base, the ceiling base, and the grooved base is small, so a trouble is less likely to occur even when the stress relaxation properties of the bonding layer are low.

In the specification, the low thermal expansion metal material is a metal material that has a coefficient of linear thermal expansion from 40° C. to 400° C., less than or equal to $10 \times 10^{-6}$/K, preferably less than or equal to $9.0 \times 10^{-6}$/K, and more preferably less than or equal to $8.0 \times 10^{-6}$/K. In the specification, the coefficient of linear thermal expansion obtained by measuring the length at 40° C. and the length at 400° C. is referred to as the coefficient of linear thermal expansion from 40° C. to 400° C. In the specification, the main component is a component that occupies 50 percent by mass or higher of the entire component contained, preferably 70 percent by mass or higher, and more preferably 90 percent by mass or higher. In the specification, up and down, right and left, front and rear, and the like can be used for describing the present invention; however, up and down, right and left, and front and rear are only relative positional relationships. Therefore, when the orientation of the wafer placement table is changed, up and down can be right and left or right and left can be up and down. The technical scope of the present invention also encompasses such a case.

In the first wafer placement table of the present invention, the absolute value of a difference in coefficient of linear thermal expansion from 40° C. to 400° C. between the ceramic material that is a component of the ceramic base and each of the metal matrix composite material or the low thermal expansion metal material that is a component of the ceiling base and the ceramic material that is a component of the grooved base may be less than or equal to $1.5 \times 10^{-6}$/K. With this configuration, even when the stress relaxation properties of the bonding layer are low, a trouble is further less likely to occur.

In the first wafer placement table of the present invention, the ceramic material that is a component of the ceramic base may be alumina, and the ceramic material that is a component of the grooved base may be alumina lower in purity than the alumina that is a component of the ceramic base. With this configuration, it is possible to manufacture the grooved base with a lower cost.

A second wafer placement table of the present invention includes a ceramic base having a wafer placement surface on its top surface and incorporating an electrode, a cooling base in which a refrigerant flow channel is formed, and a metal bonding layer that bonds a bottom surface of the ceramic base with a top surface of the cooling base, wherein the cooling base includes a ceiling base made of a metal matrix composite material or a low thermal expansion metal material and defining a ceiling of the refrigerant flow channel, a perforated base of which a main component is made of the same ceramic material as a main component of the ceramic base and through which a flow channel hole defining a side wall of the refrigerant flow channel extends in an up and down direction, a bottom base defining a bottom of the refrigerant flow channel, a metal ceiling bonding layer that bonds a bottom surface of the ceiling base with a top surface of the perforated base, and a bottom bonding layer that bonds a bottom surface of the perforated base with a top surface of the bottom base.

In the second wafer placement table of the present invention, of the cooling base, an MMC or a low thermal expansion metal material is used for the ceiling base, while a ceramic material that is relatively inexpensive and with which a flow channel hole is able to be formed with a relatively low cost by a near-net-shape manufacturing technology or the like is used for the perforated base. Therefore, a manufacturing cost for the wafer placement table is reduced. In addition, not a resin layer with a low thermal conductivity but a metal bonding layer with a high thermal conductivity is used as the bonding layer between the ceramic base and the ceiling base and between the ceiling base and the perforated base. Therefore, performance to dissipate heat from a wafer (heat dissipation performance) is high. Furthermore, since the main component of the ceramic material that is a component of the perforated base is the same as the main component of the ceramic material that is a component of the ceramic base, the absolute value of a difference in coefficient of linear thermal expansion between the perforated base and the ceramic base is small. Therefore, the absolute value of a difference in coefficient of linear thermal expansion between any two of the ceramic base, the ceiling base, and the perforated base is small, so a trouble is less likely to occur even when the stress relaxation properties of the bonding layer are low.

In the second wafer placement table of the present invention, the bottom base may be made of a metal matrix composite material or a low thermal expansion metal material, and the bottom bonding layer may be made of metal. With this configuration, since the absolute value of a difference in coefficient of linear thermal expansion between the material that is a component of the ceramic base and the material that is a component of the bottom base is small, the influence of a difference in coefficient of linear thermal expansion between the ceramic base and the ceiling base or the perforated base and the influence of a difference in coefficient of linear thermal expansion between the ceiling base or the perforated base and the bottom base are cancelled, so a warpage or breakage of the wafer placement table 10 is reduced. Therefore, the flexibility of the material that is a component of the ceiling base or the perforated base increases. Since the perforated base and the bottom base are bonded by the metal bonding layer, it is possible to bond the perforated base with the bottom base simultaneously with bonding the ceramic base with the ceiling base and bonding the ceiling base with the perforated base, so it is possible to efficiently manufacture the wafer placement table.

In the second wafer placement table of the present invention, the absolute value of a difference in coefficient of linear thermal expansion from 40° C. to 400° C. between the ceramic material that is a component of the ceramic base and each of the metal matrix composite material or the low thermal expansion metal material that is a component of the ceiling base and the ceramic material that is a component of the perforated base may be less than or equal to $1.5 \times 10^{-6}$/K. With this configuration, even when the stress relaxation properties of the bonding layer are low, a trouble is further less likely to occur.

In the second wafer placement table of the present invention, the ceramic material that is a component of the ceramic base may be alumina, and the ceramic material that is a component of the perforated base may be alumina lower in purity than the alumina that is a component of the ceramic base. With this configuration, it is possible to manufacture the perforated base with a lower cost.

DETAILED DESCRIPTION OF THE INVENTION

First Embodiment

Figure 1:
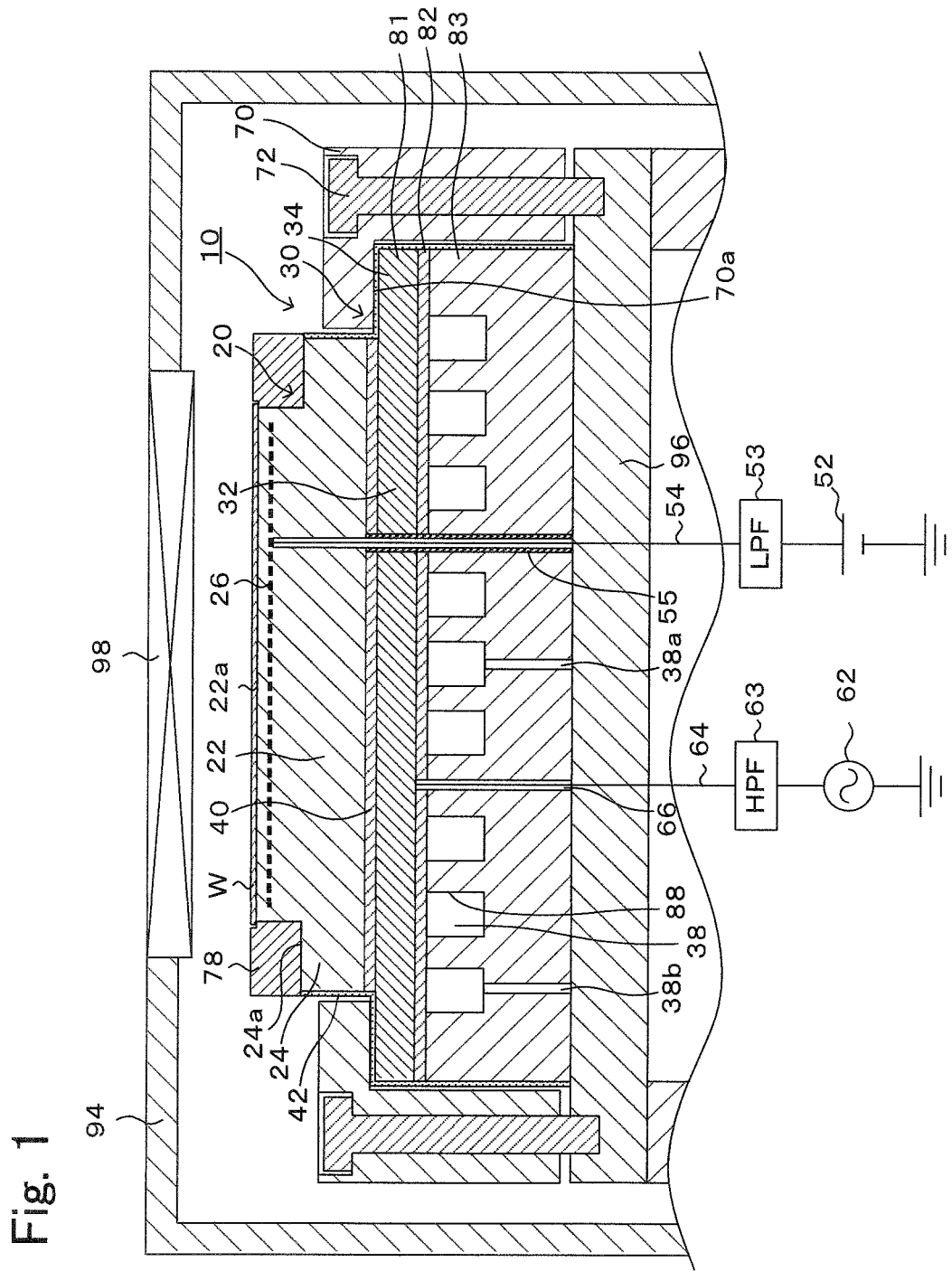
FIG. 1 is a longitudinal sectional view of a wafer placement table 10 placed in a chamber 94.
Figure 2:
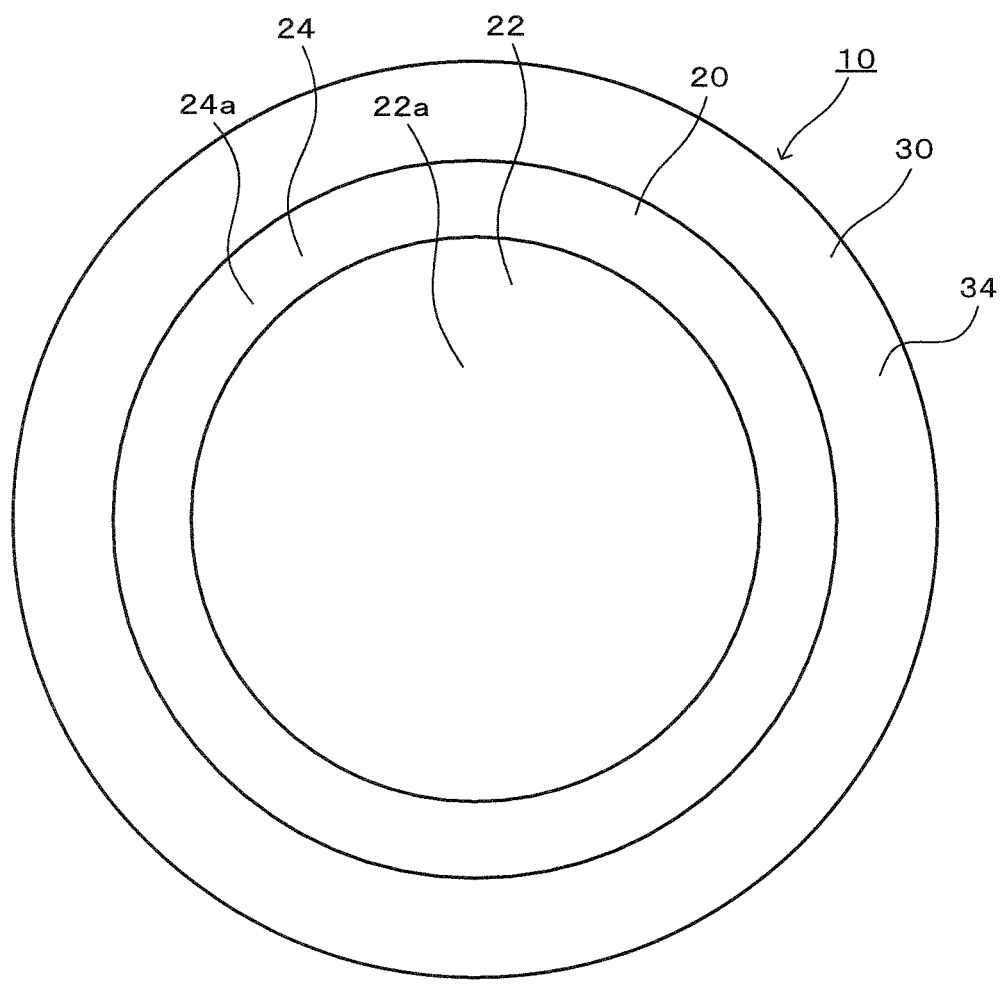
FIG. 2 is a plan view of the wafer placement table 10.
Figure 3:
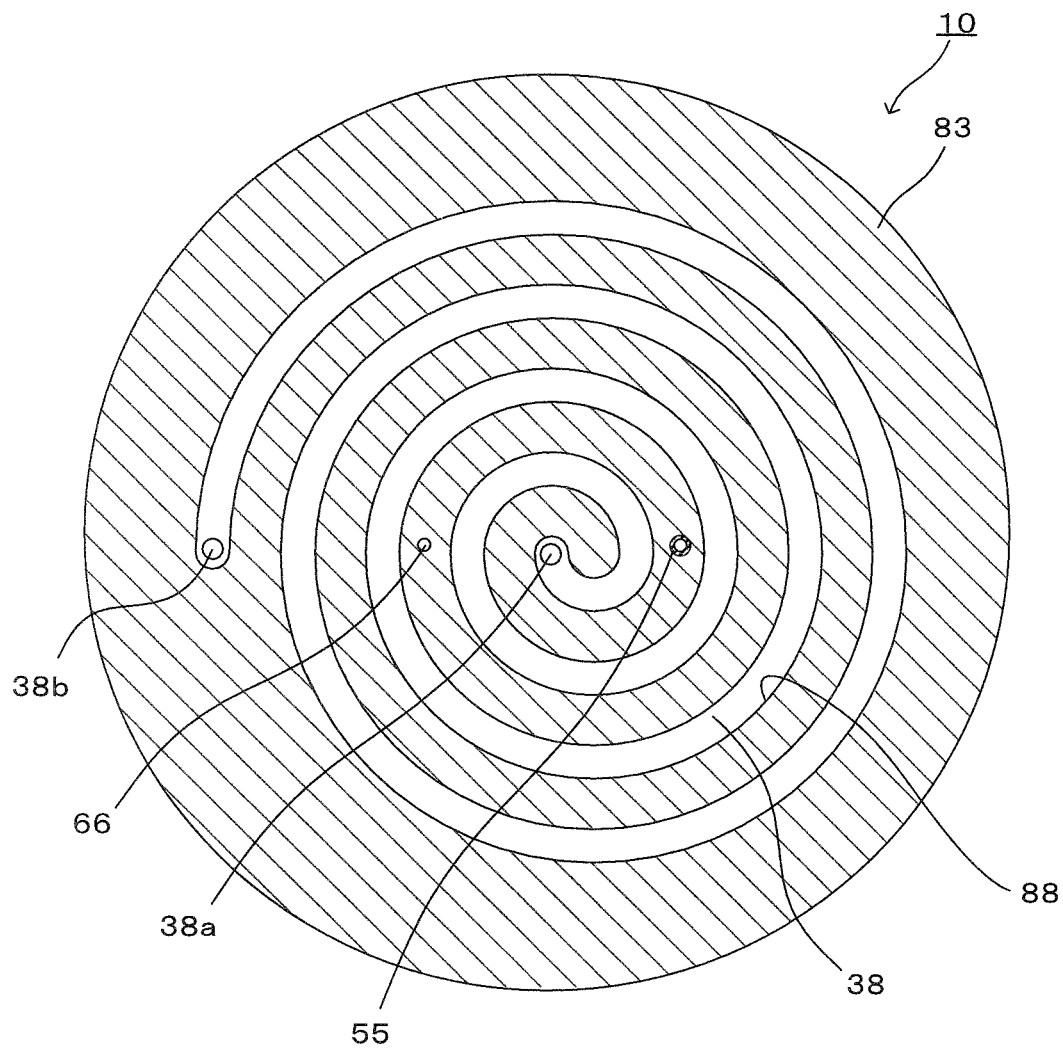
FIG. 3 is a sectional view of the wafer placement table 10 when a cross section taken along a top surface of a grooved base 83 is viewed from above.

A wafer placement table 10 of a first embodiment of the present invention will be described below with reference to the drawings. FIG. 1 is a longitudinal sectional view of the wafer placement table 10 placed in a chamber 94 (a sectional view taken along a plane including the central axis of the wafer placement table 10), FIG. 2 is a plan view of the wafer placement table 10, and FIG. 3 is a sectional view of the wafer placement table 10 when a cross section taken along a top surface of a grooved base 83 is viewed from above. In the specification, "X to Y" indicating a numeric range is used as a meaning of including numeric values X and Y as a lower limit value and an upper limit value.

The wafer placement table 10 is used to perform CVD, etching, or the like on a wafer W by using plasma, and is fixed to a mounting plate 96 provided inside the semiconductor process chamber 94. The wafer placement table 10 includes a ceramic base 20, a cooling base 30, and a metal bonding layer 40.

The ceramic base 20 includes an outer peripheral part 24 having an annular focus ring placement surface 24a, on the outer peripheral side of a central part 22 having a circular wafer placement surface 22a. Hereinafter, a focus ring may be abbreviated as "FR". A wafer W is placed on the wafer placement surface 22a, and a focus ring 78 is placed on the FR placement surface 24a. The ceramic base 20 is made of a ceramic material, typically, alumina, aluminum nitride, or the like. The FR placement surface 24a is lower in level than the wafer placement surface 22a.

The central part 22 of the ceramic base 20 incorporates a wafer attraction electrode 26 on the side close to the wafer placement surface 22a. The wafer attraction electrode 26 is made of a material that contains, for example, W, Mo, WC, MoC, or the like. The wafer attraction electrode 26 is a disc-shaped or mesh-shaped single-pole electrostatic electrode. A layer of the ceramic base 20 on the upper side of the wafer attraction electrode 26 functions as a dielectric layer. A wafer attraction direct current power supply 52 is connected to the wafer attraction electrode 26 via a power supply terminal 54. The power supply terminal 54 is provided so as to pass through an electrically insulating tube 55 disposed in a through-hole extending through the cooling base 30 and the metal bonding layer 40 in the up and down direction and reach the wafer attraction electrode 26 from the bottom surface of the ceramic base 20. A low pass filter (LPF) 53 is provided between the wafer attraction direct current power supply 52 and the wafer attraction electrode 26.

The cooling base 30 is a disk member having a larger diameter than the ceramic base 20 and has an inner peripheral part 32 on which the ceramic base 20 is disposed and an outer peripheral part 34 projecting from the outer periphery of the ceramic base 20. The cooling base 30 includes a ceiling base 81, a grooved base 83, and a ceiling bonding layer 82. The cooling base 30 has a refrigerant flow channel 38 in which refrigerant is able to circulate. The refrigerant flow channel 38 is spirally provided from an inlet 38a to an outlet 38b so as to extend over the entire area in which the ceramic base 20 is disposed (FIG. 3). The inlet 38a and the outlet 38b of the refrigerant flow channel 38 extend through the grooved base 83 in the up and down direction and open at the bottom surface of the refrigerant flow channel 38. The inlet 38a and the outlet 38b of the refrigerant flow channel 38 are connected to a refrigerant cooling device (not shown), and refrigerant discharged from the outlet 38b is adjusted in temperature in the refrigerant cooling device, then returned to the inlet 38a again, and supplied into the refrigerant flow channel 38.

The ceiling base 81 is a disk member made of a metal matrix composite material (also referred to as metal matrix composite (MMC)). The ceiling base 81 defines the ceiling of the refrigerant flow channel 38. The absolute value of a difference in coefficient of linear thermal expansion from 40° C. to 400° C. between an MMC used for the ceiling base 81 and the ceramic material used for the ceramic base 20 is preferably less than or equal to $1.5 \times 10^{-6}$/K, more preferably less than or equal to $1.0 \times 10^{-6}$/K, and further preferably less than or equal to $0.5 \times 10^{-6}$/K. Examples of the MMC include a material including Si, SiC, and Ti, and a material obtained by impregnating an SiC porous body with Al and/or Si. The material including Si, SiC, and Ti is referred to as SiSiCTi, the material that impregnates an SiC porous body with Al is referred to as AlSiC, and the material that impregnates an SiC porous body with Si is referred to as SiSiC. When the ceramic base 20 is an alumina base, the MMC used for the ceiling base 81 is preferably AlSiC, SiSiCTi, or the like. The coefficient of linear thermal expansion from 40° C. to 400° C. is $7.2 \times 10^{-6}$/K for alumina, $7.8 \times 10^{-6}$/K for AlSiC (SiC 75%), and $7.3 \times 10^{-6}$/K for SiSiCTi. When the ceramic base 20 is an aluminum nitride base, the MMC used for the ceiling base 81 is preferably AlSiC, SiSiC, or the like. The coefficient of linear thermal expansion from 40° C. to 400° C. is $4.6 \times 10^{-6}$/K for aluminum nitride, and $5.6 \times 10^{-6}$/K for AlSiC (SiC 85%). The ceiling base 81 also functions as a radio-frequency (RF) electrode for generating plasma together with the metal bonding layer 40 and the metal ceiling bonding layer 82. The power supply terminal 64 is provided so as to pass through a through-hole 66 extending through the grooved base 83 and the ceiling bonding layer 82 in the up and down direction and reach the bottom surface of the ceiling base 81. A high pass filter (HPF) 63 is disposed between the ceiling base 81 and the RF power supply 62.

The grooved base 83 is a disk member made of a ceramic material. As shown in FIG. 3, a flow channel groove 88 that defines the bottom and side wall of the refrigerant flow channel 38 is provided on the top surface of the grooved base 83. The main component of a ceramic material used for the grooved base 83 is the same as the main component of the ceramic material used for the ceramic base 20. The main component is a component that occupies 50 percent by mass or higher of the entire component contained, preferably 70 percent by mass or higher, and more preferably 90 percent by mass or higher. The absolute value of a difference in coefficient of linear thermal expansion between ceramic materials having the same main component is small. The ceramic material that is a component of the grooved base 83 may be a material having the same main component as the ceramic material that is a component of the ceramic base 20 and lower in purity than the ceramic material that is a component of the ceramic base 20. For example, an alumina with a high purity (for example, alumina 99% or higher) may be used for the ceramic base 20 from the viewpoint of improvement in electrical characteristics as a dielectric layer, and an alumina with a low purity (for example, alumina 95%) may be used for the grooved base 83 from the viewpoint of improvement in mechanical characteristics, such as ductility, and cost reduction. The material lower in purity may contain a greater amount of glassy material, such as $SiO_2$, than the material higher in purity. The absolute value of a difference in coefficient of linear thermal expansion from 40° C. to 400° C. between the ceramic material used for the grooved base 83 and the ceramic material used for the ceramic base 20 is preferably less than or equal to $1.5 \times 10^{-6}$/K, more preferably less than or equal to $1.0 \times 10^{-6}$/K, and further preferably less than or equal to $0.5 \times 10^{-6}$/K. The absolute value of a difference in coefficient of linear thermal expansion from 40° C. to 400° C. between the ceramic material used for the grooved base 83 and the MMC used for the ceiling base 81 is preferably less than or equal to $1.5 \times 10^{-6}$/K, more preferably less than or equal to $1.0 \times 10^{-6}$/K, and further preferably less than or equal to $0.5 \times 10^{-6}$/K.

The ceiling bonding layer 82 is a metal bonding layer that bonds the bottom surface of the ceiling base 81 with the top surface of the grooved base 83. The ceiling bonding layer 82 may be, for example, a layer made of solder or a brazing metal material. The ceiling bonding layer 82 is formed by, for example, TCB (thermal compression bonding). TCB is a known method of sandwiching a metal bonding material between two members to be bonded and bonding the two members in a state of being heated to a temperature lower than or equal to a solidus temperature of the metal bonding material. The material of the ceiling bonding layer 82 may be the same as the material of the metal bonding layer 40.

The metal bonding layer 40 bonds the bottom surface of the ceramic base 20 with the top surface of the cooling base 30. The metal bonding layer 40 may be, for example, a layer made of solder or a brazing metal material. The metal bonding layer 40 is formed by, for example, TCB.

The side surface of the outer peripheral part 24 of the ceramic base 20, the outer periphery of the metal bonding layer 40, and the side surface of the cooling base 30 are coated with an electrically insulating film 42. Examples of the electrically insulating film 42 include a sprayed film made of alumina, yttria, or the like.

The thus configured wafer placement table 10 is attached to the mounting plate 96 inside the chamber 94 by using a clamp member 70. The clamp member 70 is an annular member with a substantially inverted L-shaped cross section and has an inner peripheral step surface 70a. The wafer placement table 10 and the mounting plate 96 are united by the clamp member 70. In a state where the inner peripheral step surface 70a of the clamp member 70 is placed on the outer peripheral part 34 of the cooling base 30 of the wafer placement table 10, bolts 72 are inserted from the top surface of the clamp member 70 and screwed to threaded holes provided on the top surface of the mounting plate 96. The bolts 72 are mounted at multiple locations (for example, eight locations or 12 locations) provided at equal intervals along the circumferential direction of the clamp member 70. The clamp member 70 and the bolts 72 may be made of an electrically insulating material or may be made of an electrically conductive material (metal or the like).

Figure 4:
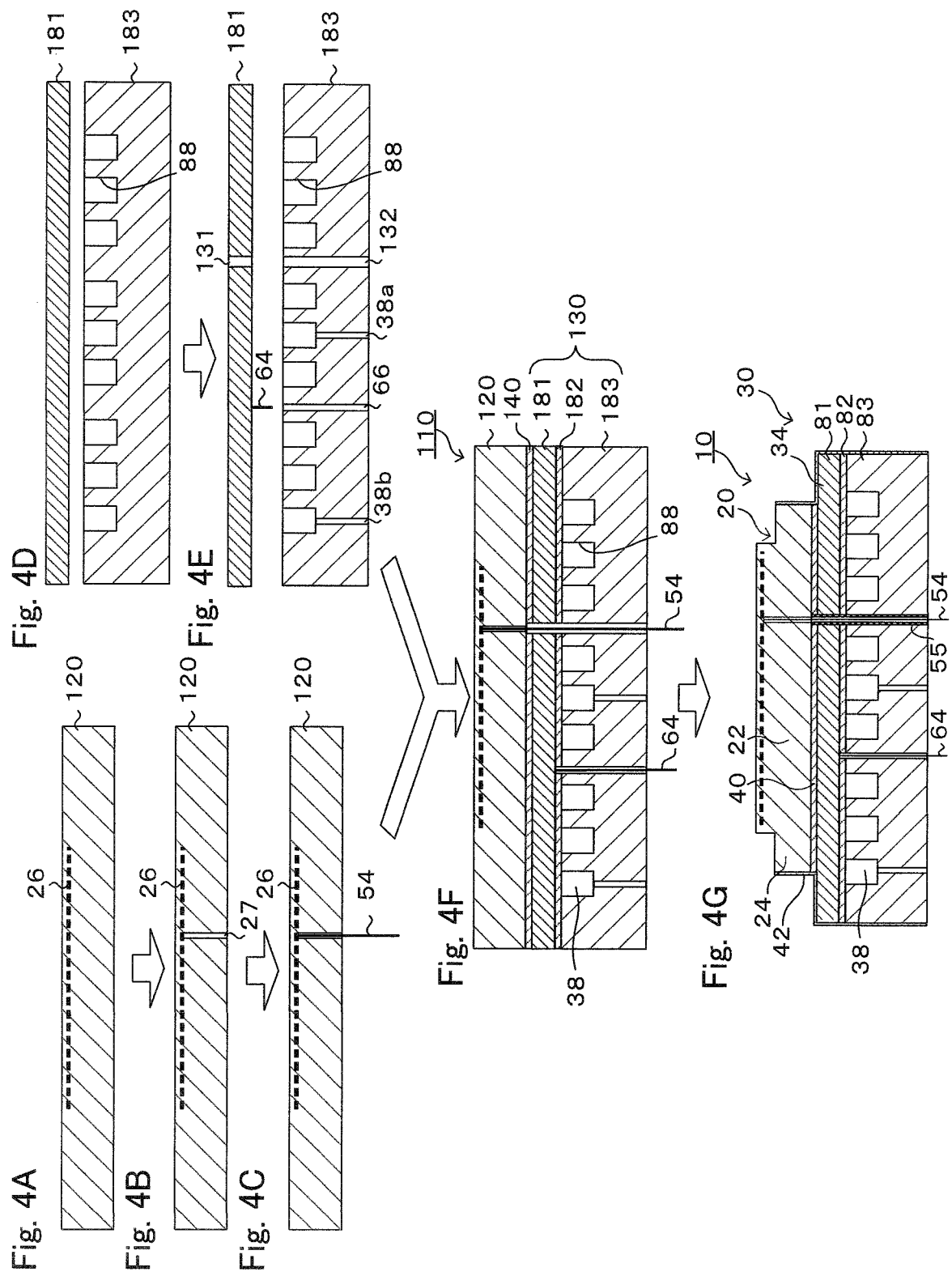
FIGS. 4A to 4G are manufacturing process charts of the wafer placement table 10.

Next, an example of manufacturing of the wafer placement table 10 will be described with reference to FIGS. 4A to 4G. FIGS. 4A to 4G are manufacturing process charts of the wafer placement table 10. Initially, a disk-shaped ceramic sintered body 120 that is the source of the ceramic base 20 is made by firing a ceramic powder mold by hot pressing (FIG. 4A). The ceramic sintered body 120 incorporates the wafer attraction electrode 26. Subsequently, a hole 27 is perforated from the bottom surface of the ceramic sintered body 120 to the wafer attraction electrode 26 (FIG. 4B), the power supply terminal 54 is inserted into the hole 27 and bonded to the wafer attraction electrode 26 (FIG. 4C).

In parallel with this, an MMC disk member 181 and a ceramic material grooved disk member 183 on the top surface of which the flow channel groove 88 is formed are made (FIG. 4D). Subsequently, a through-hole 131 extending through the MMC disk member 181 in the up and down direction is formed, through-holes 132, 66 extending through the grooved disk member 183 in the up and down direction and the inlet 38a and the outlet 38b that extend through the grooved disk member 183 in the up and down direction and that open at the bottom surface of the flow channel groove 88 are formed, and the power supply terminal 64 is bonded to the bottom surface of the MMC disk member 181 at a location facing the through-hole 66 (FIG. 4E). When the ceramic sintered body 120 is made of alumina, the MMC disk member 181 is preferably made of SiSiCTi or AlSiC. This is because the coefficient of thermal expansion of alumina and the coefficient of thermal expansion of SiSiCTi or AlSiC are almost the same. When the ceramic sintered body 120 is made of alumina, the grooved disk member 183 is preferably made of alumina lower in purity than that of the ceramic sintered body 120. The grooved disk member 183 can be made by, for example, a near-net-shape manufacturing technology.

The disk member made of SiSiCTi can be made by, for example, as follows. Initially, a powder mixture is made by mixing silicon carbide, metal Si and metal Ti. After that, a disc-shaped mold is made by uniaxial pressing of the obtained powder mixture, and the mold is sintered by hot pressing in an inert atmosphere, with the result that the disk member made of SiSiCTi is obtained.

When the grooved disk member 183 is made by using a near-net-shape manufacturing technology, the grooved disk member 183 may be made, for example, as follows. In other words, a mold with a predetermined shape, which will be shaped into the grooved base 83 after firing, is made by laminating a plurality of ceramic green sheets, and the mold is fired under normal atmospheric pressure, with the result that the grooved base 83 can be obtained. The mold may be made by mold casting or may be made by a 3D printer using stereo lithography. Alternatively, the mold may be made by making a disk-shaped mold without a groove and then forming a groove corresponding to the flow channel groove 88 by cutting or the like.

Subsequently, a metal bonding material is disposed on each of the top surface of the MMC disk member 181 and the top surface of the grooved disk member 183. A necessary through-hole is provided in each metal bonding material in advance. Then, the power supply terminal 64 of the MMC disk member 181 is inserted into the through-hole 66 of the grooved disk member 183, and the MMC disk member 181 is placed on the metal bonding material disposed on the top surface of the grooved disk member 183. Furthermore, the power supply terminal 54 of the ceramic sintered body 120 is inserted into the through-hole 131 of the MMC disk member 181 and the through-hole 132 of the grooved disk member 183, and the ceramic sintered body 120 is placed on the metal bonding material disposed on the top surface of the MMC disk member 181. Thus, a laminated body in which the grooved disk member 183, the metal bonding material, the MMC disk member 181, the metal bonding material, and the ceramic sintered body 120 are laminated in this order from the bottom is obtained. By pressuring the laminated body while heating the laminated body (TCB), a bonded body 110 is obtained (FIG. 4F). The bonded body 110 is configured such that the ceramic sintered body 120 is bonded to the top surface of an MMC/ceramic block 130, which is the source of the cooling base 30, via the metal bonding layer 140. The MMC/ceramic block 130 is the one in which the MMC disk member 181 and the grooved disk member 183 are bonded via the metal ceiling bonding layer 182. The MMC/ceramic block 130 has the refrigerant flow channel 38 inside.

TCB is performed, for example, as follows. In other words, the laminated body is pressurized at a temperature lower than or equal to a solidus temperature of the metal bonding material (for example, higher than or equal to a temperature obtained by subtracting 20° C. from the solidus temperature and lower than or equal to the solidus temperature) to perform bonding, after that the temperature is returned to a room temperature. Thus, the metal bonding material becomes the metal bonding layer. An Al—Mg bonding material or an Al—Si—Mg bonding material may be used as the metal bonding material at this time. When, for example, TCB is performed by using an Al—Si—Mg bonding material, the laminated body is pressurized in a state of being heated under vacuum atmosphere. The metal bonding material with a thickness of about 100 μm is preferable.

Subsequently, the ceramic base 20 with the central part 22 and the outer peripheral part 24 is obtained by cutting the outer periphery of the ceramic sintered body 120 to form a step. The metal bonding layer 40 and the cooling base 30 are obtained by cutting as needed the outer periphery of the metal bonding layer 140 and the MMC/ceramic block 130. At this time, the outer peripheral part 34 of the cooling base 30 projects from the outer periphery of the ceramic base 20.

The electrically insulating tube 55 that allows insertion of the power supply terminal 54 is disposed in the through-holes 131, 132, the hole of the metal bonding layer 40, and the hole of the ceiling bonding layer 82. The side surface of the outer peripheral part 24 of the ceramic base 20, the periphery of the metal bonding layer 40, and the side surface of the cooling base 30 are subjected to thermal spraying by using ceramic powder to form the electrically insulating film 42 (FIG. 4G). Thus, the wafer placement table 10 is obtained.

Next, an example of the use of the wafer placement table 10 will be described with reference to FIG. 1. The wafer placement table 10 is fixed to the mounting plate 96 of the chamber 94 by the clamp member 70 as described above. A shower head 98 that discharges process gas from a large number of gas injection holes into the chamber 94 is disposed on the ceiling surface of the chamber 94.

A focus ring 78 is placed on the FR placement surface 24a of the wafer placement table 10, and a disc-shaped wafer W is placed on the wafer placement surface 22a. The focus ring 78 has a step along the inner periphery of an upper end part so as not to interfere with the wafer W. In this state, a wafer W is attracted to the wafer placement surface 22a by applying a direct current voltage of the wafer attraction direct current power supply 52 to the wafer attraction electrode 26. Then, the inside of the chamber 94 is set to a predetermined vacuum atmosphere (or decompression atmosphere), and an RF voltage from the RF power supply 62 is applied to the ceiling base 81 while process gas is being supplied from the shower head 98. As a result, plasma is generated between the wafer W and the shower head 98. Then, the wafer W is subjected to CVD deposition or etching by using the plasma. As the wafer W is subjected to a plasma process, the focus ring 78 abrades; however, the focus ring 78 is thicker than the wafer W, replacement of the focus ring 78 is performed after processing a plurality of wafers W.

In the wafer placement table 10 of the first embodiment described above, of the cooling base 30, an MMC is used for the ceiling base 81, while a ceramic material that is relatively inexpensive and with which the flow channel groove 88 is able to be formed with a relatively low cost by a near-net-shape manufacturing technology or the like is used for the grooved base 83. Therefore, a manufacturing cost for the wafer placement table is reduced. In addition, not a resin layer with a low thermal conductivity but a metal bonding layer with a high thermal conductivity is used as the bonding layer between the ceramic base 20 and the ceiling base 81 and between the ceiling base 81 and the grooved base 83. Therefore, heat dissipation performance is high. Furthermore, since the main component of the ceramic material that is a component of the grooved base 83 is the same as the main component of the ceramic material that is a component of the ceramic base 20, the absolute value of a difference in coefficient of linear thermal expansion between the grooved base 83 and the ceramic base 20 is small. Therefore, the absolute value of a difference in coefficient of linear thermal expansion between any two of the ceramic base 20, the ceiling base 81, and the grooved base 83 is small, so a trouble is less likely to occur even when the stress relaxation properties of the bonding layer are low.

Of the cooling base 30, since an MMC higher in ductility than a ceramic material is used for the ceiling base 81 disposed at a part (a part above the refrigerant flow channel 38) where thermal stress tends to occur at the time of processing a wafer W with high-power plasma, the wafer placement table 10 is less likely to break even when thermal stress occurs.

Furthermore, since an MMC has conductivity, the ceiling base 81 is able to be used as an RF electrode, so another RF electrode does not need to be prepared. Since the metal bonding layer 40 and the ceiling bonding layer 82 are made of metal, these may be used as an RF electrode.

In the wafer placement table 10, the absolute value of a difference in coefficient of linear thermal expansion between any two of the ceramic material that is a component of the ceramic base 20, the MMC that is a component of the ceiling base 81, and the ceramic material that is a component of the grooved base 83 is less than or equal to $1.5 \times 10^{-6}$/K, a trouble is less likely to occur even when the stress relaxation properties of the bonding layer are low.

Since the absolute value of a difference in coefficient of linear thermal expansion between the ceramic material that is a component of the ceramic base 20 and the ceramic material that is a component of the grooved base 83 is small, the influence of a difference in coefficient of linear thermal expansion between the ceramic base 20 and the ceiling base 81 or the influence of a difference in coefficient of linear thermal expansion between the ceiling base 81 and the grooved base 83 are cancelled, so a warpage or breakage of the wafer placement table 10 is reduced. Therefore, the flexibility of the material that is a component of the ceiling base 81 increases.

Second Embodiment

Figure 5:
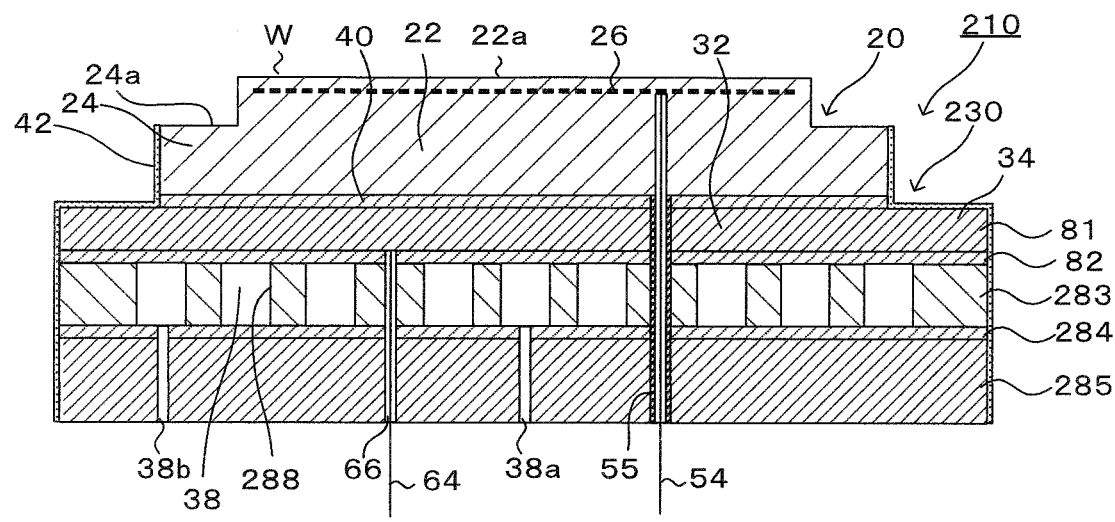
FIG. 5 is a longitudinal sectional view of a wafer placement table 210.

A wafer placement table 210 of a second embodiment of the present invention will be described below with reference to the drawings. FIG. 5 is a longitudinal sectional view of the wafer placement table 210. In FIG. 5, like reference signs are assigned to the same components as those of the first embodiment.

The wafer placement table 210 is used similarly to the wafer placement table 10. The wafer placement table 210 includes the ceramic base 20, a cooling base 230, and the metal bonding layer 40.

The cooling base 230 is a disk member greater in diameter than the ceramic base 20. The cooling base 230 includes the ceiling base 81, a perforated base 283, a bottom base 285, the ceiling bonding layer 82, and a bottom bonding layer 284. The cooling base 230 has the refrigerant flow channel 38 in which refrigerant is able to circulate. The inlet 38a and the outlet 38b of the refrigerant flow channel 38 extend through the bottom base 285 in the up and down direction and open at the bottom surface of the refrigerant flow channel 38.

The perforated base 283 is a disk member made of a ceramic material. A flow channel hole 288 that defines the side wall of the refrigerant flow channel 38 extends through the perforated base 283 in the up and down direction. The details of the ceramic material used for the perforated base 283 is the same as the ceramic material used for the grooved base 83. The perforated base 283 may be made by using a near-net-shape manufacturing technology.

The bottom base 285 is a disk member made of an MMC. The bottom base 285 defines the bottom of the refrigerant flow channel 38. The details of the MMC used for the bottom base 285 is similar to the MMC used for the ceiling base 81. The MMC used for the bottom base 285 preferably has the same main component as the MMC used for the ceiling base 81; however, the main component may be different. The MMC used for the bottom base 285 may be the same material as the MMC used for the ceiling base 81. The absolute value of a difference in coefficient of linear thermal expansion from 40° C. to 400° C. between the MMC used for the bottom base 285 and the ceramic material used for the ceramic base 20 is preferably less than or equal to $1.5 \times 10^{-6}$/K, more preferably less than or equal to $1.0 \times 10^{-6}$/K, and further preferably less than or equal to $0.5 \times 10^{-6}$/K.

The bottom bonding layer 284 is a metal bonding layer that bonds the bottom surface of the perforated base 283 with the top surface of the bottom base 285. The bottom bonding layer 284 may be, for example, a layer made of solder or a brazing metal material. The bottom bonding layer 284 is formed by, for example, TCB. The material of the bottom bonding layer 284 may be the same as the material of at least one of the metal bonding layer 40 and the ceiling bonding layer 82.

The thus configured wafer placement table 210 can be, for example, made according to the example of manufacturing of the wafer placement table 10 of FIGS. 4A to 4G as described below. The process of FIG. 4A to FIG. 4C is configured as in the case of the example of manufacturing of the wafer placement table 10. In the process of FIG. 4D, instead of making the MMC disk member 181 and the grooved disk member 183, a ceiling MMC disk member, a perforated disk member made of a ceramic material, and a bottom MMC disk member are made. The two MMC disk members are made according to the MMC disk member 181, and the perforated disk member is made according to the grooved disk member 183. After that, according to the process of FIG. 4E, a through-hole is formed in each of the two MMC disk members and the perforated disk member. Subsequently, according to the process of FIG. 4F, a laminated body in which the bottom MMC disk member, the metal bonding material, the perforated disk member, the metal bonding material, the ceiling MMC disk member, the metal bonding material, and the ceramic sintered body are laminated in this order from the bottom is made, and the laminated body is bonded by TCB to make a bonded body. Finally, according to the process of FIG. 4G, cutting is performed, the electrically insulating tube 55 is disposed, and the electrically insulating film 42 is formed. Thus, the wafer placement table 210 is obtained.

In the wafer placement table 210 of the second embodiment described above, of the cooling base 230, an MMC is used for the ceiling base 81, while a ceramic material that is relatively inexpensive and with which the flow channel hole 288 is able to be formed with a relatively low cost by a near-net-shape manufacturing technology or the like is used for the perforated base 283. Therefore, a manufacturing cost for the wafer placement table is reduced. In addition, not a resin layer with a low thermal conductivity but a metal bonding layer with a high thermal conductivity is used as the bonding layer between the ceramic base 20 and the ceiling base 81 and between the ceiling base 81 and the perforated base 283. Therefore, heat dissipation performance is high. Furthermore, since the main component of the ceramic material that is a component of the perforated base 283 is the same as the main component of the ceramic material that is a component of the ceramic base 20, the absolute value of a difference in coefficient of linear thermal expansion between the perforated base 283 and the ceramic base 20 is small. Therefore, the absolute value of a difference in coefficient of linear thermal expansion between any two of the ceramic base 20, the ceiling base 81, and the perforated base 283 is small, so a trouble is less likely to occur even when the stress relaxation properties of the bonding layer are low.

Of the cooling base 230, since an MMC higher in ductility than a ceramic material is used for the ceiling base 81 disposed at a part where thermal stress tends to occur at the time of processing a wafer W with high-power plasma, the wafer placement table 210 is less likely to break even when thermal stress occurs.

Furthermore, since an MMC has conductivity, the ceiling base 81 is able to be used as an RF electrode, so another RF electrode does not need to be prepared. Since the metal bonding layer 40, the ceiling bonding layer 82, and the bottom bonding layer 284 are made of metal, these may be used as an RF electrode. The MMC bottom base 285 may be used as an RF electrode.

Furthermore, since the bottom base 285 is made of an MMC and the absolute value of a difference in coefficient of linear thermal expansion between the MMC of the bottom base 285 and the ceramic material that is a component of the ceramic base 20 is small, the influence of a difference in coefficient of linear thermal expansion between the ceramic base 20 and the ceiling base 81 or the perforated base 283 and the influence of a difference in coefficient of linear thermal expansion between the ceiling base 81 or the perforated base 283 and the bottom base 285 are cancelled, so a warpage or breakage of the wafer placement table 210 is reduced. Therefore, the flexibility of the material that is a component of the ceiling base 81 or the perforated base 283 increases.

Since the perforated base 283 and the bottom base 285 are bonded by the metal bottom bonding layer 284, it is possible to bond the perforated base 283 with the bottom base 285 simultaneously with bonding the ceramic base 20 with the ceiling base 81 and bonding the ceiling base 81 with the perforated base 283, so it is possible to efficiently manufacture the wafer placement table 210.

Since the influence of the bottom base 285 on heat dissipation performance is small, the bottom base 285 may be bonded by a resin layer or the like. Therefore, the bottom base 285 does not need to be made of an MMC, and may be, for example, made of a high thermal expansion metal with a relatively large coefficient of linear thermal expansion (for example made of aluminum), or may be made of ceramics, or may be made of resin. The bottom bonding layer 284 does not need to be made of metal and may be, for example, made of resin.

In the wafer placement table 210, the absolute value of a difference in coefficient of linear thermal expansion between any two of the ceramic material that is a component of the ceramic base 20, the MMC that is a component of the ceiling base 81, and the ceramic material that is a component of the perforated base 283 is less than or equal to $1.5 \times 10^{-6}$/K, a trouble is less likely to occur even when the stress relaxation properties of the bonding layer are low. Furthermore, when the absolute value of a difference in coefficient of linear thermal expansion between the MMC that is a component of the bottom base 285 and each of these materials is less than or equal to $1.5 \times 10^{-6}$/K, a trouble is further less likely to occur even when the stress relaxation properties of the bonding layer are low.

The present invention is not limited to the above-described embodiments and may be, of course, implemented in various modes within the technical scope of the present invention.

For example, in the wafer placement table 10 of the first embodiment, a hole may be provided so as to extend through the wafer placement table 10 from the bottom surface of the cooling base 30 to the wafer placement surface 22a. Examples of such a hole include a gas supply hole for supplying heat transfer gas (for example, He gas) to the back surface of a wafer W and a lift pin hole for allowing insertion of a lift pin for lifting or lowering a wafer W with respect to the wafer placement surface 22a. Heat transfer gas is supplied to a space formed by the wafer W and a large number of small protrusions (which support a wafer W) (not shown) provided on the wafer placement surface 22a. The lift pin hole is provided at three locations when a wafer W is supported by, for example, three lift pins. The wafer placement table 210 of the second embodiment may also have a gas supply hole, a lift pin hole, or the like.

Figure 6:
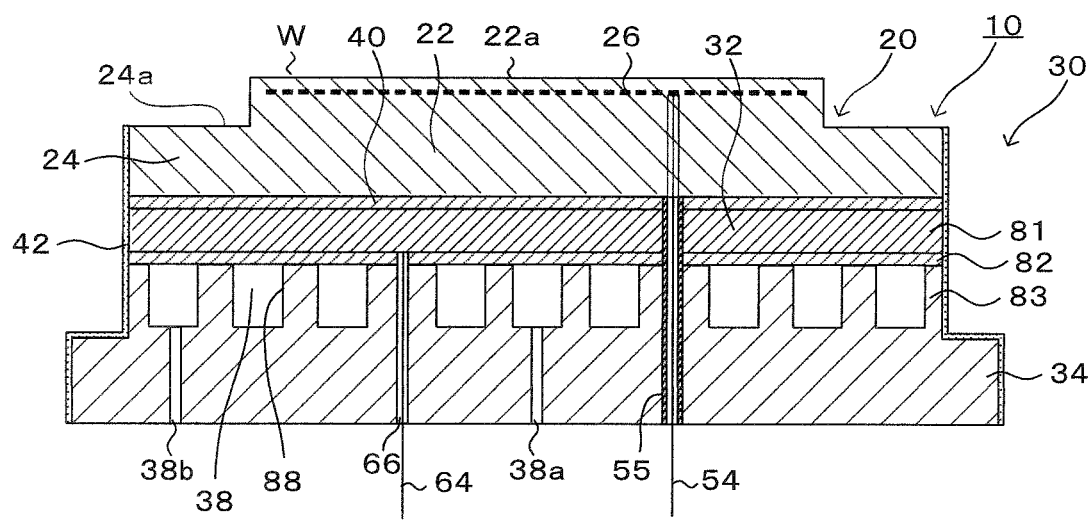
FIG. 6 is a longitudinal sectional view of another embodiment of the wafer placement table 10.

In the wafer placement table 10 of the above-described first embodiment, the cooling base 30 is a disk member with no step; however, as shown in FIG. 6, the top surface of the outer peripheral part 34 may be lowered by level with respect to the top surface of the inner peripheral part 32 to provide a disk member with a step. In FIG. 6, a step is provided at the outer periphery of the grooved base 83; however, the location of a step is not limited, and a step may be provided at the outer periphery of the ceiling base 81. The wafer placement table 210 of the second embodiment may also have a step at one or more of the outer peripheries of the ceiling base 81, the perforated base 283, and the bottom base 285.

In the wafer placement table 10 of the above-described first embodiment, the ceiling base 81 is made of an MMC; however, the ceiling base 81 may be made of a low thermal expansion metal material. In this case, the low thermal expansion metal material, as well as an MMC, preferably has a high ductility and conductivity. In addition, the absolute value of a difference in coefficient of linear thermal expansion from 40° C. to 400° C. between the low thermal expansion metal material and the ceramic material used for the ceramic base 20 is preferably less than or equal to $1.5 \times 10^{-6}$/K. Examples of the low thermal expansion metal material include molybdenum and tungsten. The ceiling base made of a low thermal expansion metal material may be, for example, a molybdenum base when the ceramic base 20 is an aluminum nitride base. The coefficient of linear thermal expansion from 40° C. to 400° C. is $4.6 \times 10^{-6}$/K for aluminum nitride, and $5.6 \times 10^{-6}$/K for molybdenum. In the wafer placement table 210 of the second embodiment as well, the ceiling base 81 may be made of a low thermal expansion metal material. In this case, the bottom base 285 may also be made of a low thermal expansion metal material. In the wafer placement table 210 of the second embodiment, one of the ceiling base 81 and the bottom base 285 may be made of an MMC, and the other may be made of a low thermal expansion metal material.

In the above-described first and second embodiments, the wafer attraction electrode 26 is incorporated in the central part 22 of the ceramic base 20. Instead of or in addition to this, an RF electrode for generating plasma may be incorporated. In this case, a radio-frequency power supply is connected to not the ceiling base 81 but the RF electrode. A focus ring (FR) attraction electrode may be incorporated in the outer peripheral part 24 of the ceramic base 20. In this case, a direct current power supply is connected to the FR attraction electrode. The ceramic base 20 may incorporate a heater electrode (resistance heating element). In this case, a heater power supply is connected to the heater electrode. In this way, the ceramic base 20 may incorporate one layer of electrode or may incorporate two or more layers of electrode.

In the above-described first and second embodiments, the refrigerant flow channel 38 is spirally provided from the inlet 38a to the outlet 38b; however, the planar shape of the refrigerant flow channel 38 is not limited. A plurality of the refrigerant flow channels 38 may be provided. The cross section of the refrigerant flow channel 38 is rectangular; however, the cross-sectional shape of the refrigerant flow channel 38 is not limited. For example, upper-side edge portions of the cross section of the refrigerant flow channel 38 may be rounded surfaces. With this configuration, it is possible to prevent occurrence of cracks from the upper-side edge portions of the cross section of the refrigerant flow channel as starting points. In this case, a rounded surface may be provided on the ceiling base 81.

In the above-described first embodiment, the ceramic sintered body 120 of FIG. 4A is made by firing a ceramic powder mold by hot pressing. The mold at that time may be made by laminating a plurality of tape molds, or may be made by mold casting, or may be made by compacting ceramic powder. The same applies to the second embodiment.

In the above-described first embodiment, after the grooved disk member 183 in which the flow channel groove 88 is formed is made, the through-holes 132, 66, the inlet 38a, and the outlet 38b are formed. Alternatively, the grooved disk member 183 with the through-holes 132, 66, the inlet 38a, and the outlet 38b may be made by using a near-net-shape manufacturing technology. The same applies to the second embodiment.

The present application claims priority from Japanese Patent Application No. 2021-166081, filed on Oct. 8, 2021, the entire contents of which are incorporated herein by reference.

What is claimed is:

1. A wafer placement table comprising:
   a ceramic base material having a wafer placement surface on its top surface and incorporating an electrode;
   a cooling base material in which a refrigerant flow channel is formed; and
   a metal bonding layer that bonds a bottom surface of the ceramic base material with a top surface of the cooling base material, wherein
   the cooling base material includes a ceiling base material made of a metal matrix composite material or a low thermal expansion metal material and defining a ceiling of the refrigerant flow channel, a grooved base material of which a main component is made of the same ceramic material as a main component of the ceramic base material and on a top surface of which a flow channel groove defining a bottom and a side wall of the refrigerant flow channel is provided, and a metal ceiling bonding layer that bonds a bottom surface of the ceiling base material with the top surface of the grooved base material.

2. The wafer placement table according to claim 1, wherein
   the absolute value of a difference in coefficient of linear thermal expansion from 40° C. to 400° C. between the ceramic material that is a component of the ceramic base material and each of the metal matrix composite material or the low thermal expansion metal material that is a component of the ceiling base material and the ceramic material that is a component of the grooved base material is less than or equal to $1.5 \times 10^{-6}$/K.

3. The wafer placement table according to claim 1, wherein the ceramic material that is a component of the ceramic base material is alumina, and the ceramic material that is a component of the grooved base material is alumina lower in purity than the alumina that is a component of the ceramic base material.

4. A wafer placement table comprising:
   a ceramic base material having a wafer placement surface on its top surface and incorporating an electrode;

a cooling base material in which a refrigerant flow channel is formed; and a metal bonding layer that bonds a bottom surface of the ceramic base material with a top surface of the cooling base material, wherein the cooling base material includes a ceiling base material made of a metal matrix composite material or a low thermal expansion metal material and defining a ceiling of the refrigerant flow channel, a perforated base material of which a main component is made of the same ceramic material as a main component of the ceramic base material and through which a flow channel hole defining a side wall of the refrigerant flow channel extends in an up and down direction, a bottom base material defining a bottom of the refrigerant flow channel, a metal ceiling bonding layer that bonds a bottom surface of the ceiling base material with a top surface of the perforated base material, and a bottom bonding layer that bonds a bottom surface of the perforated base material with a top surface of the bottom base material.

5. The wafer placement table according to claim 4, wherein the bottom base material is made of a metal matrix composite material or a low thermal expansion metal material, and the bottom bonding layer is made of metal.

6. The wafer placement table according to claim 4, wherein the absolute value of a difference in coefficient of linear thermal expansion from 40° C. to 400° C. between the ceramic material that is a component of the ceramic base material and each of the metal matrix composite material or the low thermal expansion metal material that is a component of the ceiling base material and the ceramic material that is a component of the perforated base material is less than or equal to $1.5 \times 10^{-6}$/K.

7. The wafer placement table according to claim 4, wherein the ceramic material that is a component of the ceramic base material is alumina, and the ceramic material that is a component of the perforated base material is alumina lower in purity than the alumina that is a component of the ceramic base material.

* * * * *